(12) United States Patent
Gustafsson

(10) Patent No.: US 6,845,164 B2
(45) Date of Patent: Jan. 18, 2005

(54) METHOD AND DEVICE FOR SEPARATING A MIXTURE OF SOURCE SIGNALS

(75) Inventor: Tony Gustafsson, Mölndal (SE)

(73) Assignee: Telefonaktiebolaget LM Ericsson (PUBL), Stockholm (SE)

( * ) Notice: Subject to any disclaimer, the term of this patent is extended or adjusted under 35 U.S.C. 154(b) by 504 days.

(21) Appl. No.: 09/947,755

(22) Filed: Sep. 7, 2001

(65) Prior Publication Data
US 2002/0051500 A1 May 2, 2002

Related U.S. Application Data

(63) Continuation of application No. PCT/SE00/00451, filed on Mar. 7, 2000.

(51) Int. Cl.⁷ ............................................. H04B 15/00
(52) U.S. Cl. ...................... 381/94.1; 381/66; 702/190
(58) Field of Search ...................... 381/94.1, 94.2, 381/94.3, 94.7, 94.9, 66; 708/322; 706/22; 702/190, 191, 194, 195; 375/316

(56) References Cited

U.S. PATENT DOCUMENTS

| | | | |
|---|---|---|---|
| 5,168,459 A | | 12/1992 | Hiller |
| 5,491,754 A | * | 2/1996 | Jot et al. ........................ 381/63 |
| 5,539,832 A | * | 7/1996 | Weinstein et al. .......... 381/94.1 |
| 5,568,519 A | * | 10/1996 | Baier et al. .................. 375/343 |
| 5,694,474 A | | 12/1997 | Ngo et al. |
| 5,825,671 A | * | 10/1998 | Deville ........................ 702/191 |
| 5,909,646 A | * | 6/1999 | Deville ........................ 455/313 |
| 5,999,956 A | * | 12/1999 | Deville ........................ 708/322 |
| 6,002,776 A | * | 12/1999 | Bhadkamkar et al. ......... 381/66 |
| 6,185,309 B1 | * | 2/2001 | Attias ........................ 381/94.1 |
| 6,317,703 B1 | * | 11/2001 | Linsker ........................ 702/190 |
| 6,577,675 B2 | * | 6/2003 | Lindgren et al. ........... 375/148 |
| 6,625,587 B1 | * | 9/2003 | Erten et al. ................... 706/22 |
| 6,654,719 B1 | * | 11/2003 | Papadias ...................... 704/233 |
| 6,711,528 B2 | * | 3/2004 | Dishman et al. ............ 702/189 |
| 2002/0085741 A1 | * | 7/2002 | Shimizu ...................... 382/118 |
| 2002/0136328 A1 | * | 9/2002 | Shimizu ...................... 375/316 |
| 2004/0057585 A1 | * | 3/2004 | Madievski et al. ......... 381/94.1 |

FOREIGN PATENT DOCUMENTS

WO  WO 99/16170  *  1/1999  ................ 381/94.1

* cited by examiner

Primary Examiner—Xu Mei
(74) Attorney, Agent, or Firm—Burns, Doane, Swecker & Mathis, L.L.P.

(57) ABSTRACT

Device and method for separating a mixture of source signals to regain the source signals, the device and method being based on measured signals, the invention comprises: bringing each measured signal to a separation structure including an adaptive filter, the adaptive filter comprising filter coefficients; using a generalized criterion function for obtaining the filter coefficients, the generalized criterion function comprising cross correlation functions and a weighting matrix, the cross correlation functions being dependent on the filter coefficients; estimating the filter coefficients, the resulting estimates of the filter coefficients corresponding to a minimum value of the generalized criterion function; and updating the adaptive filter with the filter coefficients.

11 Claims, 6 Drawing Sheets

METHOD AND DEVICE FOR SEPARATING A MIXTURE OF SOURCE SIGNALS

This application is a continuation of International Application No. PCT/SE00/00451 filed on Mar. 7, 2000.

TECHNICAL FIELD

The present inventions relates to a metod and device for separating a mixture of source signals to regain the source signals.

BACKGROUND OF THE INVENTION

In recent time several papers concerning signal separation of dynamically mixed source signals have been put forward [1–3, 8, 17, 19, 20]. In principle it is possible to separate the sources exploiting only second order statistics, cf. [8]. The blind signal separation problem with dynamic/convolutive mixtures is solved in the frequency domain in several papers presented, cf. [3, 20]. Basically, dynamic source separation in the frequency domain aims to solve a number of static/instantaneous source separation problems, one for each frequency bin in question. In order to obtain the dynamic channel system (mixing matrix), the estimates corresponding to different frequencies bins, have to be interpolated. This procedure seems to be a nontrivial task, due to scaling and permutation indeterminacies [16]. The approach in the present paper is a "time-domain approach", see [8], which models the elements of the channel system with Finite Impulse Response (FIR) filters, thus avoiding this indeterminacies.

A quasi-maximum likelihood method for signal separation by second order statistics is presented by Pham and Garat in [11]. An algorithm is presented for static mixtures, i.e. mixing matrices without delays. Each separated signal $s_i$, $i=1, \ldots, M$ is filtered with a Linear Time Invariant (LTI) filter $h_i$. The criterion used is the estimated cross-correlations for these filtered signals. The optimal choice of the filter $h_i$, according to [11], is the filter with frequency response inversely proportional to the spectral density of the corresponding source signal. The filters $h_i$, $i=1, \ldots, M$ are thus whitening filters. However, the spectral densities of the source signals are usually unknown, and perhaps time varying. One approach is to estimate these filters as done in the present paper and in the prediction error method as presented in [1]. Moreover, several aspects of the algorithm presented in [8] remained open.

SUMMARY OF THE INVENTION

Characterizing features of the present invention, i.e. the method for separating a mixture of source signals to regain the source signals; are bringing each measured signal to a separation structure including an adaptive filter, the adaptive filter comprising filter coefficients; using a generalised criterion function for obtaining the filter coefficients, the generalised criterion function comprising cross correlation functions and a weighting matrix, the cross correlation functions being dependent on the filter coefficients; estimating the filter coefficients, the resulting estimates of the filter coefficients corresponding to a minimum value of the generalised criterion function; and updating the adaptive filter with the filter coefficients.

Other characterizing features of the present invention, i.e. the device for separating a mixture of source signals to regain the source signals, the input to the device being based on measured signals, the device comprises: signaling links for bringing each measured signal to a separation structure including an adaptive filter, the adaptive filter comprising filter coefficients; a generalised criterion function means for obtaining the filter coefficients, the generalised criterion function means comprising cross correlation functions and a weighting matrix, the cross correlation functions being dependent on the filter coefficients; means for estimating the filter coefficients, the resulting estimates of the filter coefficients corresponding to a minimum value output of the generalised criterion function; and updating means for updating the adaptive filter with the filter coefficients.

Specific fields of application of the present invention include mobile telephone technology, data communication, hearing aids and medical measuring equipment, such as ECG. Also included is echo cancelling which can primarily occur in the telecommunications field.

DESCRIPTION OF PREFERRED EMBODIMENTS

Figure 1A:
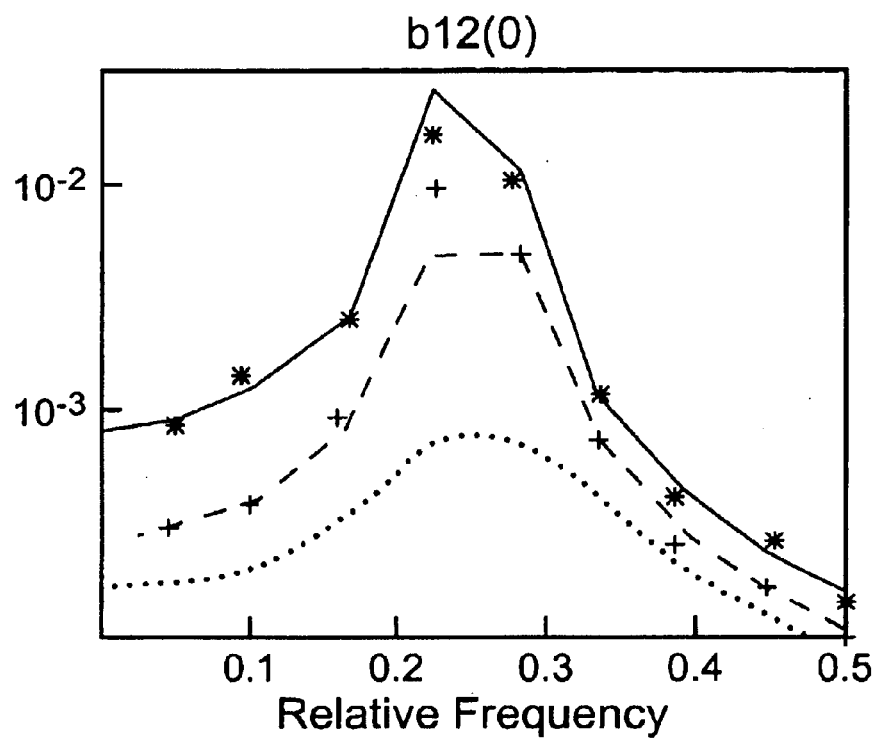
FIGS. 1A–1D show the empirical and true parameter variances of a preferred embodiment of the present invention compared to a prior art signal separation algorithms.

In the present invention a signal separation algorithm is derived and presented. A main result of the analys is an optimal weighting matrix. The weighting matrix is used to device a practical algorithm for signal separation of dynamically mixed sources. The derived algorithm significantly improves the parameter estimates in cases where the sources have similar color. In addition the statistical analysis can be used to reveal attainable (asymptotic) parameter variance given a number of known parameters.

The basis for the source signals, in the present paper, are M mutually uncorrelated white sequences. These white sequences are termed source generating signals and denoted by $\xi_k(n)$ where $k=1, \ldots, M$. The source generating signals are convolved with linear time-invariant filters $G_k(q)/F_k(q)$ and the outputs are, $$x(n) = [x_1(n) \ldots x_M(n)]^T = K(q)\xi(n)$$

$$= diag\left(\frac{G_1(q)}{F_1(q)}, \ldots, \frac{G_M(q)}{F_M(q)}\right)\begin{bmatrix}\xi_1(n) \\ \vdots \\ \xi_M(n)\end{bmatrix},$$

referred to as the source signals and where q and T is the time shift operator and matrix transpose, respectively. The following assumptions are introduced A1. The generating signal $\xi(n)$ is a realization of a stationary, white zero-mean Gaussian process:

$$\xi(n) \in N(0, \Sigma), \Sigma = diag(\sigma_1^2, \ldots \sigma_M^2)$$

A2. The elements of K(q) are filters which are asymptotically stable and have minimum phase.

Condition A1 is somewhat restrictive because of the Gaussian assumption. However, it appears to be very difficult to evaluate some of the involved statistical expectations unless the Gaussian assumption is invoked.

The source signals x(n) are unmeasurable and inputs to a system, referred to as the channel system. The channel system produces M outputs collected in a vector y(n)

$$y(n)=[y_1(n) \ldots y_M(n)]^T=B(q)x(n).$$

which are measurable and referred to as the observables. In the present paper the channel system, B(q), given in $$B(q) = \begin{bmatrix} 1 & B_{12}(q) & \cdots & B_{1M}(q) \\ B_{21}(q) & \ddots & & \vdots \\ \vdots & & \ddots & B_{(M-1)M}(q) \\ B_{M1}(q) & \cdots & B_{M(M-1)}(q) & 1 \end{bmatrix},$$

where $B_{ij}(q)$, ij=1, ... M are FIR filters. The objective is to extract the source signals from the observables. The extraction can be accomplished by means of all adaptive separation structure, cf. [8]. The inputs to the separation structure are the observable signals. The output from the separation structure, $s_1(n), \ldots, s_M(n)$, depend on the adaptive filters, $D_{ij}(q,\theta)$, i,j=1, ... M, and can be written as $$s(n,\theta)=[s_1(n,\theta) \ldots s_M(n,\theta)]^T=D(q,\theta)y(n),$$

where θ is a parameter vector containing the filter coefficients of the adaptive filters. That is the parameter vector is $\theta=[d_{11}^T \ldots d_{MM}^T]^T$ where $d_{ij}$, i,j=1, ... M are vectors containing the coefficients of $D_{ij}(q, \theta)$, i,j=1, ... M, respectively. Note, that unlike B(q) the separation matrix D(q, θ) does not contain a fixed diagonal, cf. [6, 13].

Most of the expressions and calculations in the present paper will be derived for the two-input two-output (TITO) case, M=2. The main reason for using the TITO case is that it has been shown to be parameter identifiable under a set of conditions, cf. [8]. However, the analysis in the current paper is applicable on the more general multiple-input multiple-output (MIMO) case, assuming that problem to be parameter identifiable as well.

Assuming that N samples of $y_1(n)$ and $y_2(n)$ are available, the criterion function proposed in [8], reads as $$\overline{V}(\theta) = \sum_{k=-U}^{U} \overline{R}_{s_1 s_2}^2(k;\theta),$$

where $$\overline{R}_{s_1 s_2}(k;\theta) = \frac{1}{N}\sum_{n=0}^{N-k-1} s_1(n;\theta)s_2(n+k;\theta), k=0, \ldots, U.$$

To emphasize the dependence on θ equation (2.6) can be rewritten as $$\overline{R}_{s_1 s_2}(k;\theta) = \overline{R}_{y_1 y_2}(k) - \sum_i d_{12}(i)\overline{R}_{y_2 y_2}(k-i) -$$

$$\sum_i d_{21}(i)\overline{R}_{y_1 y_1}(k+i) + \sum_i \sum_l d_{12}(i)d_{21}(l)\overline{R}_{y_2 y_1}(k-i+l),$$

where the notation $d_{12}(i)$ denotes the i:th coefficient of the filter $D_{12}(q)$.

For notational simplicity, introduce the following vector as $$\dot{r}_N(\theta)=[\dot{R}_{1,2}(-U, \theta) \ldots \dot{R}_{1,2}(U\theta)]^T$$

where the subscript N indicates that the estimated cross-covariances are based on N samples. Furthermore, introduce a positive definite weighting matrix W(θ) which possibly depends on θ too. Thus, the criterion, in equation (2.6), can be generalized as $$V_N(\theta) = \frac{1}{2}\dot{r}_N^T(\theta)W(\theta)\dot{r}_N(\theta),$$

which will be investigated. Note, the studied estimator is closely related to the type of non-linear regressions studied in [15]. The estimate of the parameters of interest are obtained as $$\hat{\theta}_N = \arg \min_\theta V_N(\theta).$$

Although the signal separation based on the criterion (2.6) has been demonstrated to perform well in practice, see for example [12], there are a couple of open problems in the contribution [8];

1. It would be interesting to find the asymptotic distribution of the estimate of $\theta_N$. Especially, an expression for the asymptotic covariance matrix is of interest. One reason for this interest, is that the user can investigate the performance for various mixing structures, without performing simulations. Potentially, further insight could be gained into what kind of mixtures that are difficult to separate. The asymptotic covariance matrix would also allow the user to compare the performance with the Cramér-Rao Lower bound (CRB), primarily to investigate how far from the optimal performance of the prediction error method the investigated method is. An investigation of the CRB for the MIMO scenario can be found in [14].

2. How should the weighting matrix W(θ) be chosen for the best possible (asymptotic) accuracy? Given the best possible weighting, and the asymptotic distribution, one can further investigate in which scenarios it is worthwhile applying a weighting W(θ)≠I, where I denotes the identity matrix.

The purpose of the present contribution is to:

Find the asymptotic distribution of the estimate of $\theta_N$.

Find the weighting matrix W(θ) that optimizes the asymptotic accuracy.

Study an implementation of the optimal weighting scheme.

In addition to A1 and A2 the following assumptions are considered to hold throughout the description:

A3. Assume that the conditions C3–C6 in [8] are fulfilled, so that the the studied TITO system is parameter identifiable.

A4. The (minimal) value of U is defined as in Proposition 5 in [8].

A5. $\|\theta\|<\infty$, i.e. $\theta_0$ is an interior point of a compact set $D_M$. Here, $\theta_0$ contains the true parameters.

This section deals with the statistical analysis and it will begin with consistency. The asymptotic properties (as N-∞) of the estimate of $\theta_N$ ($\hat{\theta}_N$) is established in the following. However, first some preliminary observations are made. In [8] it was shown that 1. As N→∞, $\dot{R}_{1,2}(k, \theta) \to R_{1,2}(k, \theta)$ with probability one (w.p.1). Thus $$V_N(\theta) \to \overline{V}(\theta), \text{ w.p.1,}$$

where $$\bar{V}(\theta) = \frac{1}{2} r^T(\theta) W(\theta) r(\theta), \ r(\theta) = [R_{s_1 s_2}(-U, \theta) \ \ldots \ R_{s_1 s_2}(U, \theta)]^T.$$

The convergence in (3.1) is uniform in a set $D_M$, where $\theta$ is a member $$\lim_{N\to\infty} \sup_{\theta \in D_M} \|V_N(\theta) - \bar{V}(\theta)\| = 0, \ w.p.1.$$

Furthermore, since the applied separation structure is of finite impulse response (FIR) type, the gradient is bounded $$\max_{1 \le i \le n\theta} \left\{ \sup_{\theta \in D_M} \left| \frac{\partial V_N(\theta)}{\partial \theta_i} \right| \right\} \le C \ w.p.1,$$

for N larger than some $N_0 < \infty$. In equation (3.4), C is some constant, $C < \infty$, and $n\theta$ denotes the dimension of $\theta$. The above discussion, together with the identifiability analysis [8] then shows the following result:

Result 1 As $N \to \infty$, $$\hat{\theta}_N \to \theta_0 \ w/p.1.$$

Having established (strong) consistency, the asymptotic distribution of $\hat{\theta}_N$ is considered. Since the $\hat{\theta}_N$ minimizes the criterion $V_N(\theta)$, $V_N(\hat{\theta}_N)=0$, where $V_N$ denotes the gradient of $V_N$. By the mean value theorem, $$0 = V_N'(\hat{\theta}_N) = V_N'(\theta_0) + V_N''(\theta_\xi)(\hat{\theta}_N - \theta_0),$$

where $\theta_\xi$ is on a line between $\hat{\theta}_N$ and $\theta_0$. Note, since $\hat{\theta}_N$ is consistent, the $\hat{\theta}_N - \theta_0$ and consequently, $\theta_\xi \to \theta_0$, as $N \to \infty$.

Next, investigate the gradient evaluated at $\theta_0$ (for notational simplicity, let $W(\theta) = W$)

$$V_N'(\theta_0) = \hat{G}^T W \hat{r}_N(\theta_0) + \frac{1}{2} \begin{bmatrix} \hat{r}_N^T(\theta_0) \frac{\partial W}{\partial \theta_1} \hat{r}_N(\theta_0) \\ \vdots \\ \hat{r}_N^T(\theta_0) \frac{\partial W}{\partial \theta_1} \hat{r}_N(\theta_0) \end{bmatrix}_{\theta=\theta_0} \simeq \hat{G}^T W \hat{r}_N(\theta_0),$$

where $$\hat{G} = \left. \frac{\partial \hat{r}_N(\theta)}{\partial \theta} \right|_{\theta=\theta_0}.$$

Note, evaluation of G is straightforward, see for example [8]. The introduced approximation does not affect the asymptotics, since the approximation error goes to zero at a faster rate than does the estimate of $r_N(\theta_0)$ ($\hat{r}_N(\theta_0)$). Furthermore, since $r_N(\theta_0)=0$, the asymptotic distribution of $V_N'(\theta)$
is identical to the asymptotic distribution of $G^T W \hat{r}_N(\theta_0)$, where $$G = \left. \frac{\partial r(\theta)}{\partial \theta} \right|_{\theta=\theta_0}.$$

Applying for example Lemma B.3 in [15], and using the fact that both $s_1(n;\theta_0)$ and $s_2(n;\theta_0)$ stationary ARMA processes, one can show that $(\sqrt{N}) G^T W \hat{r}_N(\theta_0)$ converges in distribution to a Gaussian random vector, i.e.

$$\sqrt{N} G^T W \hat{r}_N(\theta_0) \in As \ N(0, G^T W M W G),$$

where $$M = \lim_{N\to\infty} N E[t_N(\theta_0) t_N^T(\theta_0)].$$

This means that the gradient vector, is asymptotically normally distributed, with zero-mean and with a covariance matrix M.

Before presenting the main result of the current paper, the convergence of the Hessian matrix $V''_N$ must be investigated. Assuming that the limit exists, define $$\bar{V}''(\theta) = \lim_{N\to\infty} V_N''(\theta).$$

To establish the convergence of $V_N''(\theta_\xi)$, the following (standard) inequality is applied $$\|V_N''(\theta_\xi) - \bar{V}''(\theta_0)\|_F \le \|V_N''(\theta_\xi) - V_N''(\theta_0)\|_F + \|V_N''(\theta_0) - \bar{V}''(\theta_0)\|_F,$$

where $\| \ \|_F$ denotes the Frobenius norm. Due to the FIR separation structure, the second order derivatives are continuous. Moreover, since $\theta_\xi$ converges w.p.1 to $\theta_0$, the first term converges to zero w.p.1. The second term converges also to zero w.p.1. This can be shown using a similar methodology that was used to show (3.3). Note also that since the third order derivatives are bounded, the convergence is uniform in $\theta$.

It is, now, straightforward to see that the limiting Hessian $V^{-\prime\prime}$ can be written as $$\bar{V}''(\theta_0) = \lim_{N\to\infty} V''(\theta_0) = G^T W G \ w.p.1$$

Thus, for large N, $$\sqrt{N}(\hat{\theta}_N - \theta_0) \simeq \sqrt{N}(G^T W G)^{-1} G^T W t_N(\theta_0),$$

assuming the inverses exists (generically guaranteed by the identifiability conditions in A3. Here all approximation errors that goes to zero faster than $O(1/\sqrt(N))$ have been neglected. Finally, the following result can be stated.

Consider the signal separation method based on second order statistics, where $\hat{\theta}_N$ is obtained from (2.10). Then the normalized estimation error, $\sqrt(N)(\hat{\theta}_N - \theta_N)$, has a limiting zero-mean Gaussian distribution $$\sqrt{N}(\hat{\theta}_N - \theta_0) \in As N(0, P),$$

where $$P = (G^T W G)^{-1} G^T W M W G (G^T W G)^{-1}.$$

Obviously, the matrix M plays a central role, and it is of interest to find a more explicit expression. For simplicity we consider only the case when the generating signals are zero-mean, Gaussian and white (as stated in Assumption A1). It seems to be difficult to find explicit expressions for the non-Gaussian case. Note also that this is really the place where the normality assumption in A1 is crucial. For example, the asymptotic normality of $\sqrt(N) r_N(\theta_0)$ holds under weaker assumptions.

Theorem 6.4.1 in [5] indicates precisely how the components of M can be computed. These elements are actually rather easy to compute, as the following will demonstrate.

Let $$\beta_\tau = \sum_{p=-\infty}^{\infty} R_{s_1 s_1}(p;\theta_0) R_{s_2 s_2}(p+\tau;\theta_0).$$

Furthermore, introduce the following Z-transforms $$\Phi_1(z) = \sum_{k=-\infty}^{\infty} R_{s_1 s_1}(k;\theta_0) z^{-k},$$

$$\Phi_2(z) = \sum_{k=-\infty}^{\infty} R_{s_2 s_2}(k;\theta_0) z^{-k}.$$

Then it follows that $$\sum_{\tau=-\infty}^{\infty} \sum_{p=-\infty}^{\infty} R_{s_1 s_1}(p;\theta_0) R_{s_2 s_2}(p+\tau;\theta_0) z^{-\tau} = \Phi_1(z^{-1})\Phi_2(z).$$

Thus, the $\beta_\tau$'s are the covariances of an ARMA process with power spectrum $$\Phi_1(z^{-1})\Phi_2(z) =$$

$$\sigma_1^2(\sigma_2^2(1-B_{12}(z)B_{21}(z)))^2(1-\overline{B}_{12}(z^{-1})\overline{B}_{21}(z^{-1}))\left|\frac{G_1(z)}{F_1(z)}\right|^2 \left|\frac{G_2(z)}{F_2(z)}\right|^2.$$

Computation of ARMA covariances is a standard topic, and simple and efficient algorithms for doing this exists, see for example [15, Complement C7.7]. Given $\beta_\tau$ for $\tau=0 \ldots$, $2U$, the weighting matrix can, hence, be constructed as $$W = \begin{bmatrix} \beta_0 & \beta_1 & \cdots & \beta_{2U} \\ \beta_1 & \beta_0 & \ddots & \vdots \\ \vdots & & \ddots & \beta_1 \\ \beta_{2U} & \cdots & \beta_1 & \beta_0 \end{bmatrix}.$$

Thus, in the present problem formulation the separated signals are distorted with the determinant of the channel system the channel system determinant equals det $\{B(z)\}$, and one may define the reconstructed signals as $$\hat{x}_i(n) = \frac{1}{\det\{D(q,\hat{\theta})\}} s_i(n;\hat{\theta}_N),$$

as long as det$\{D(q, \theta_0)\}$ is minimum phase.

To complete our discussion, it is also pointed out how the matrix G can be computed. The elements of G are all obtained in the following manner. Using Equation (2.8). it follows that $$\frac{\partial R_{s_1 s_2}(k;\theta)}{\partial d_{21}(i)} = -R_{y_1 y_1}(k+i) + \sum_l d_{12}(l) R_{y_2 y_1}(k-l+i)$$

$$\frac{\partial R_{s_1 s_2}(k;\theta)}{\partial d_{21}(i)} = -R_{y_2 y_2}(k-i) + \sum_l d_{21}(l) R_{y_2 y_1}(k+i-l).$$

which are straightforward to compute.

Next, consider the problem of choosing W. Our findings are collected in the following result. The asymptotic accuracy of $\hat{\theta}_N$, obtained as the minimizing argument of the criterion (2.10), is optimized if $$W=W_0=M^{-1}$$

For this choice of weighting, $$P(W_0)=(G^T M^{-1} G)^{-1}$$

The accuracy is optimized in the sense that $P(W_0)-P(W)$ is positive semi-definite for all positive definite weighting matrices W.

The proof follows from well-known matrix optimization results, see for example [9, Appendix 2].

The result could have been derived directly from the ABC theory in [15, Complement C4.4]. However, the result above itself is a useful result motivating the presented analysis.

Before considering the actual implementation of the optimal weighting strategy, let us make a note on the selection of U. This parameter is a user-defined quantity, and it would be interesting to gain some insight into how it should be chosen. Note, Assumption A3 states a lower bound for U with respect to identifiability. The following result may be useful.

Assume that the optimal weighting $W_0$ is applied in the criterion (2.10). Let $P_U(W)$ denote the asymptotic covariance for this case. Then $$P_U(W_0) \geq P_{U-1}(W_0)$$

The proof follows immediately from the calculations in [15, Complement C4.4]. Note that, when the optimal weighting, $W_0$ is applied the matrices $\{P_U(W_0)\}$ forms a non-increasing sequence. However, in practice one must be aware that a too large value of U in fact may deteriorate the performance. This phenomenon may be explained by that a large value of U means that a larger value of N is required in order for the asymptotic results to be valid.

In the present section a comparison of signal separation based on an algorithm within the scope of the present invention and the algorithm in [8] will be made. The purpose for the comparison is to show the contribution of the present invention. Put differently, does the weighting lead to a significant decrease of the parameter variance? In all of our simulations, U=6. Furthermore, the term relative frequency is used in several figures. Here relative frequency corresponds to $f_{rel}=2F/F_S$ where $F_S$ is the Here the channel system is defined by $B_{12}(q)=0.3+0.1q^{-1}$ and $B_{21}(q)=0.1+0.7q^{-1}$. The source signal $x_1(n)$ is an AR(2) process with poles at radius 0.8 and angles $\pi/4$. The second source signal is, also, an AR(2) process. However, the poles are moved by adjusting the angles in the interval $[0,\pi/2]$, while keeping the radius constant at 0.8. At each angle 200 realizations have been generated and processed by the channel system and separation structure. That is to say, for each angle the resulting parameter estimates have been averaged. Finally, each realization consists of 4000 samples.

Figure 1B:
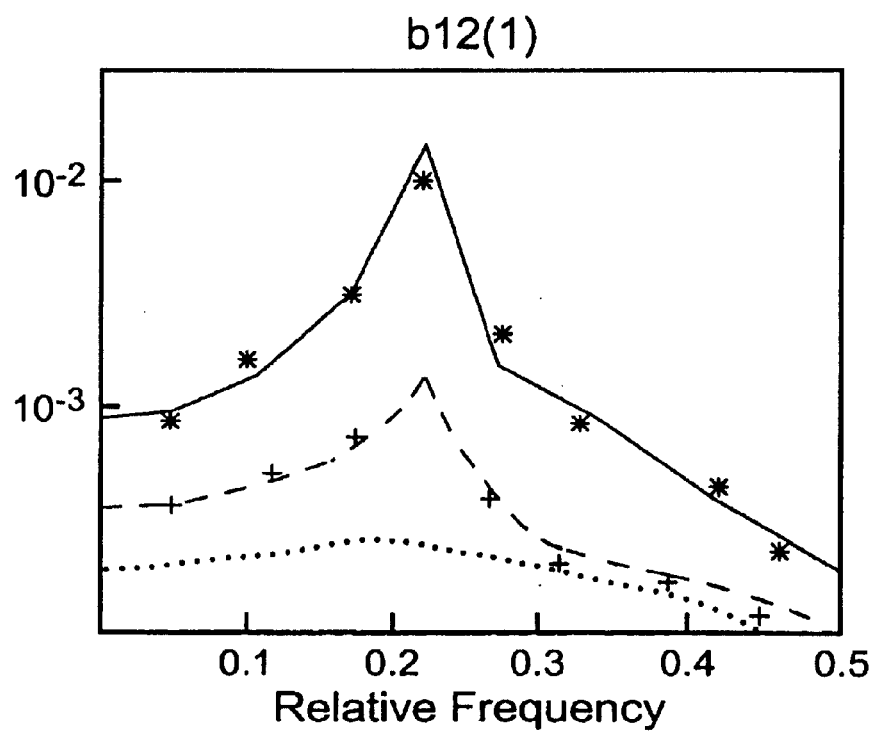
Figure 1C:
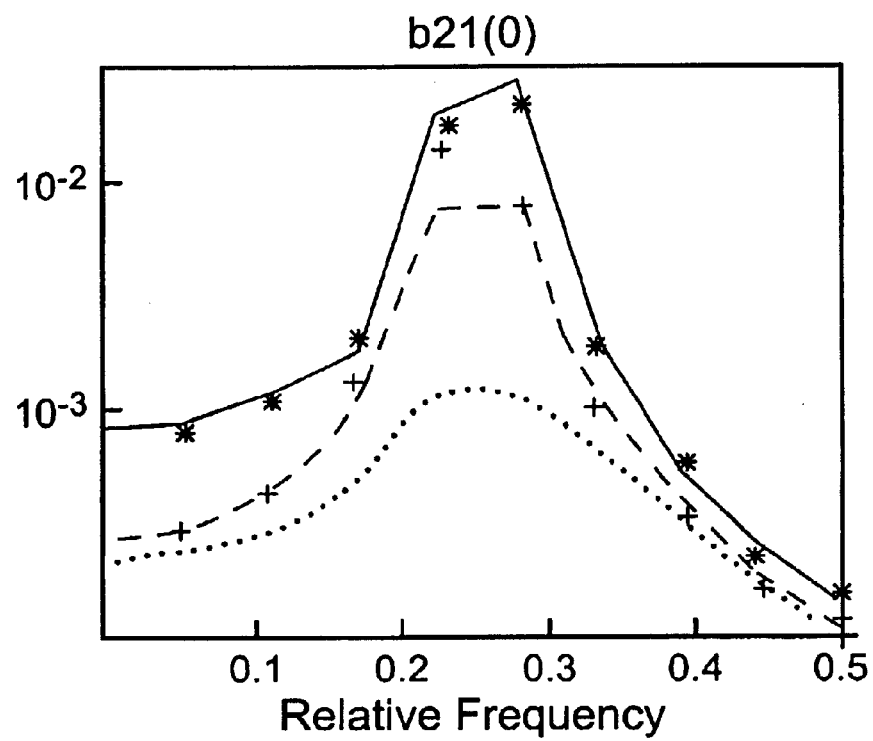
Figure 1D:
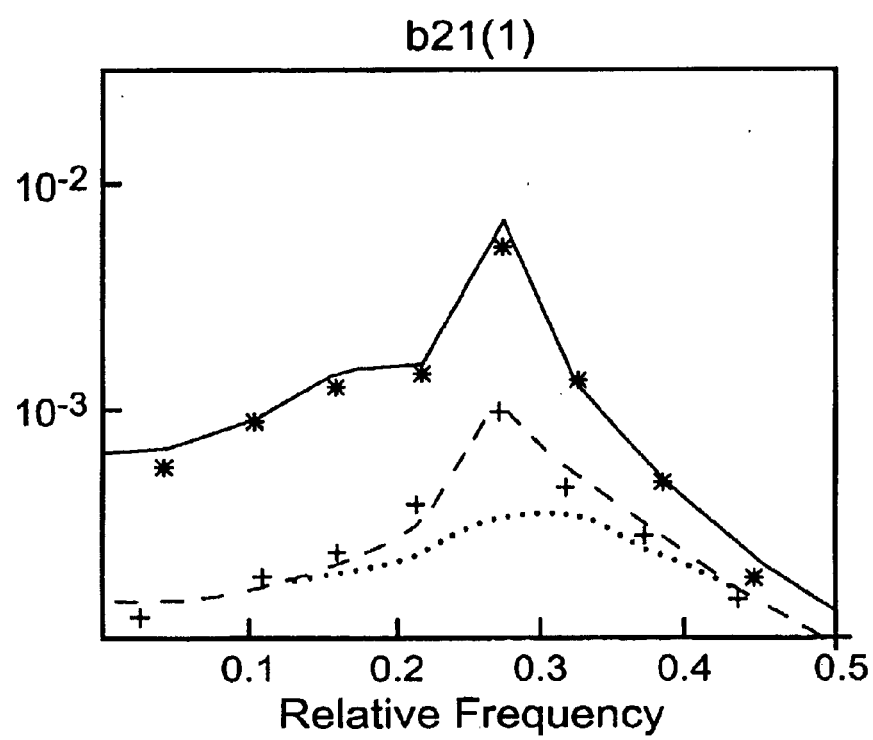

In FIGS. 1A–1D the empirical and true parameter variances are depicted. First, note the good agreement between the empirical and theoretical variances. Second, observe that the proposed weighting strategy for most angles gives rise to a significant variance reduction. In FIGS. 1A–1D, the parameter variances as a function of relative frequency. "*" denotes empirical variance of the prior art signal separation algorithm; "+" denotes empirical variance of the proposed weighting strategy. The solid line is the true asymptotic variance of the unweighted algorithm, and the dashed line is the true asymptotic variance for the optimally weighted algorithm. The dotted line is the CRB.

Figure 2A:
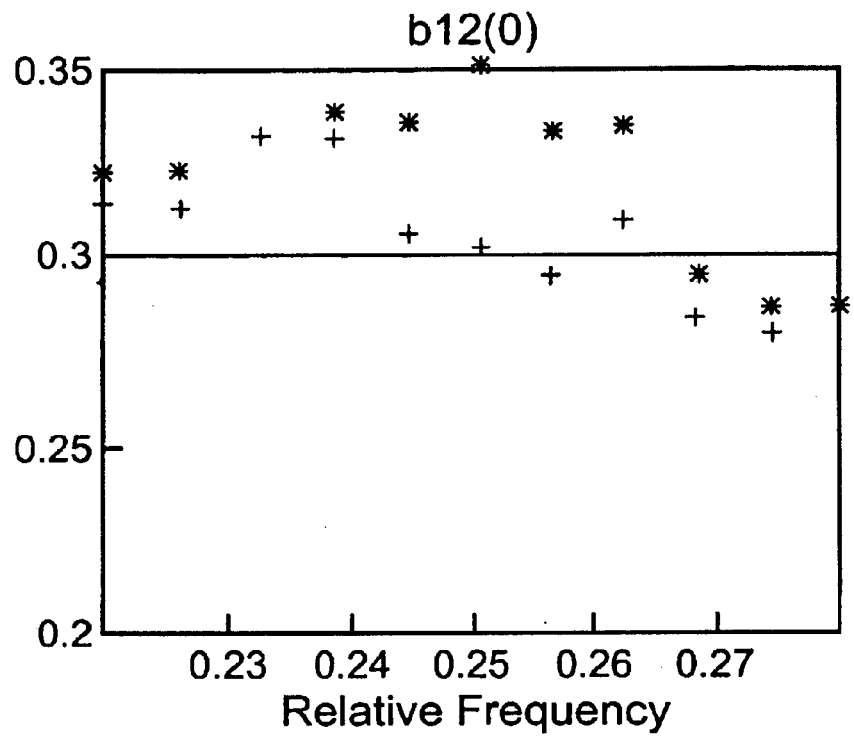
FIGS. 2A–2D show the estimated mean value as a function of relative frequency of a preferred embodiment of the present invention compared to a prior art signal separation algorithm.
Figure 2B:
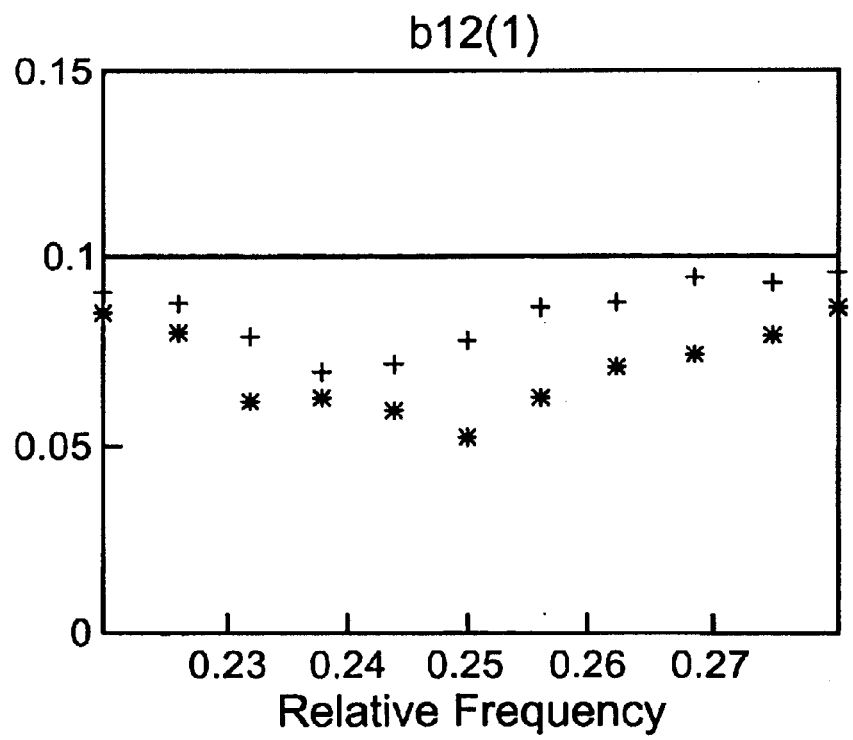
Figures 2C, 2D:
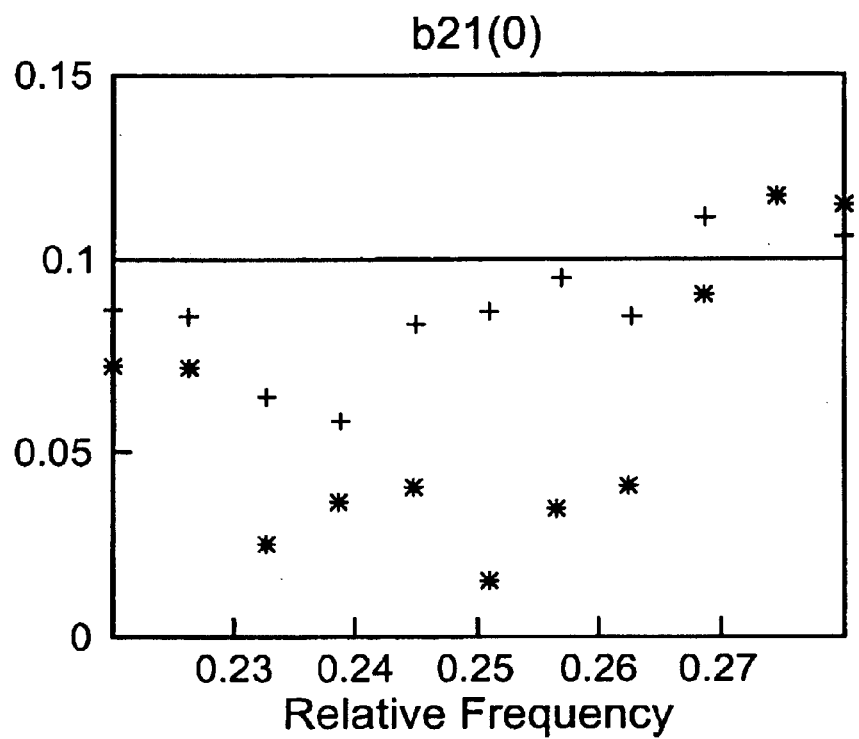
Figure 3A:
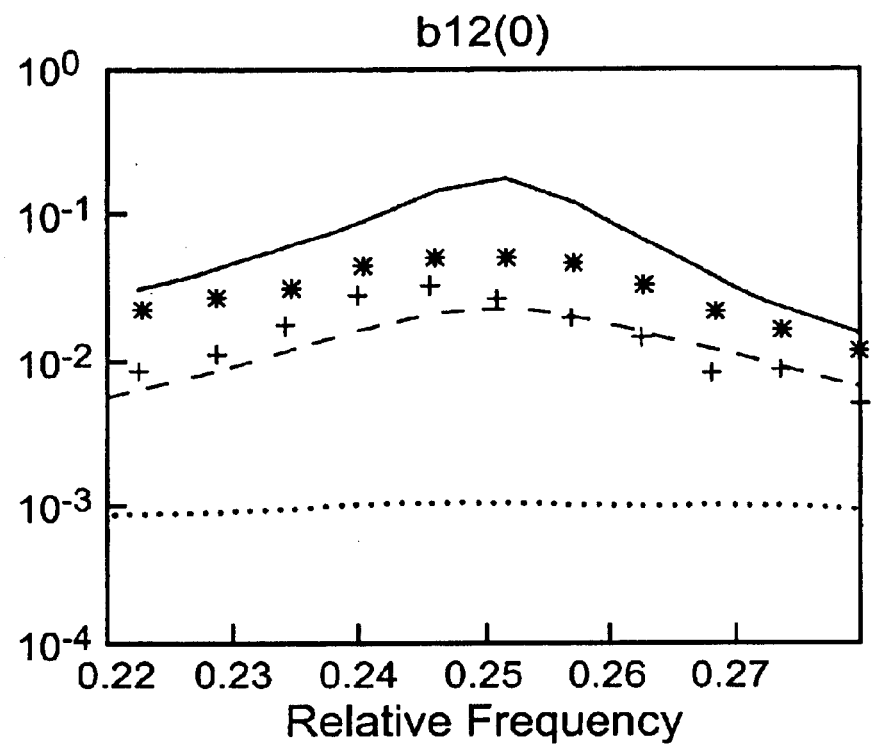
FIGS. 3A–3D show the parameter variances as a function of relative frequency of a preferred embodiment of the present invention compared to a prior art signal separation algorithm.
Figure 3B:
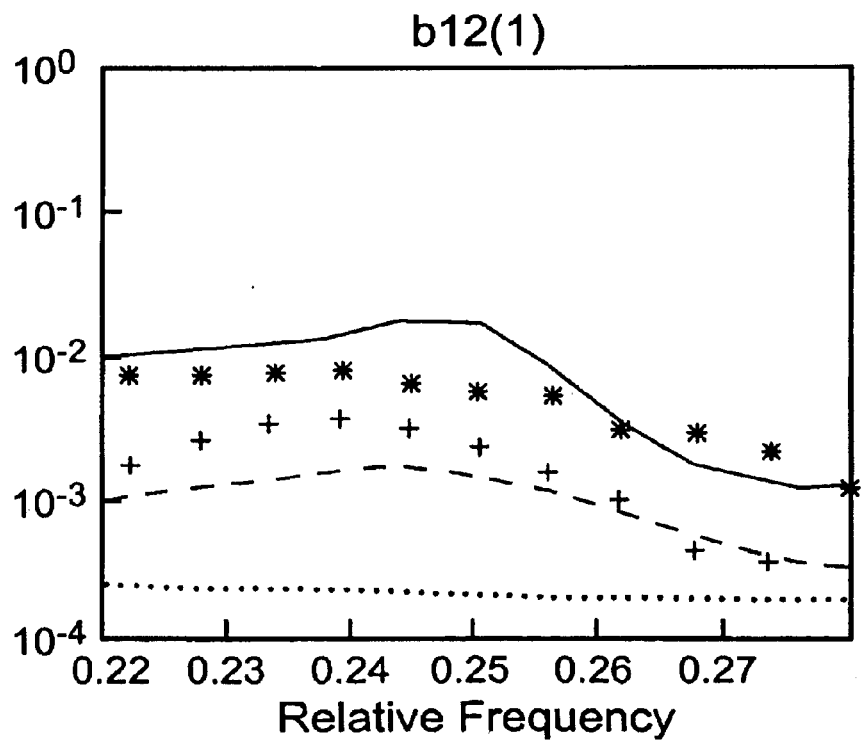
Figure 3C:
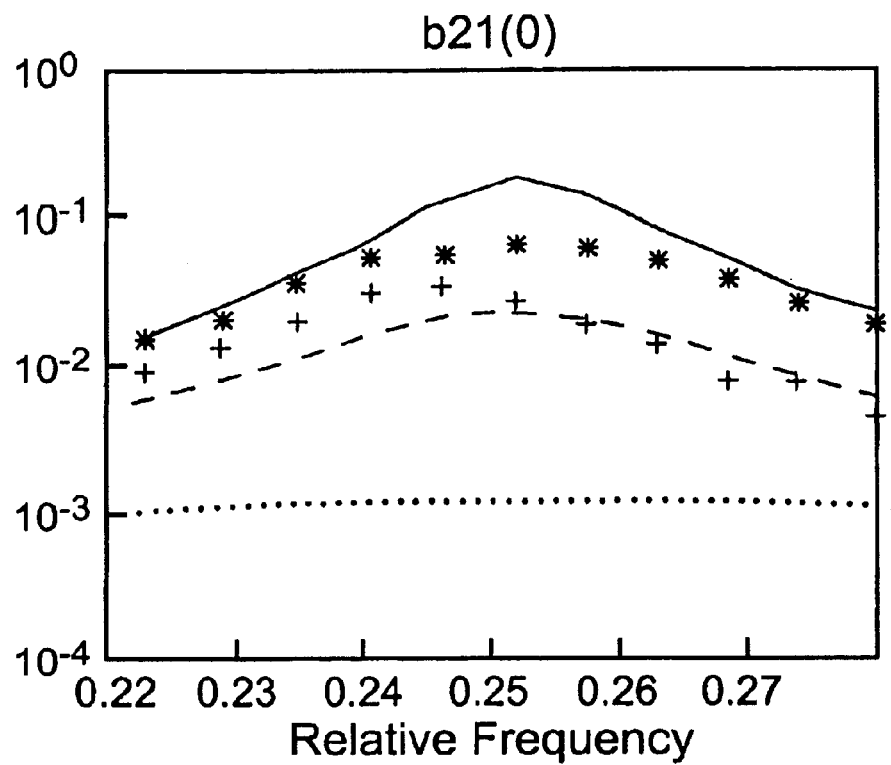
Figure 3D:
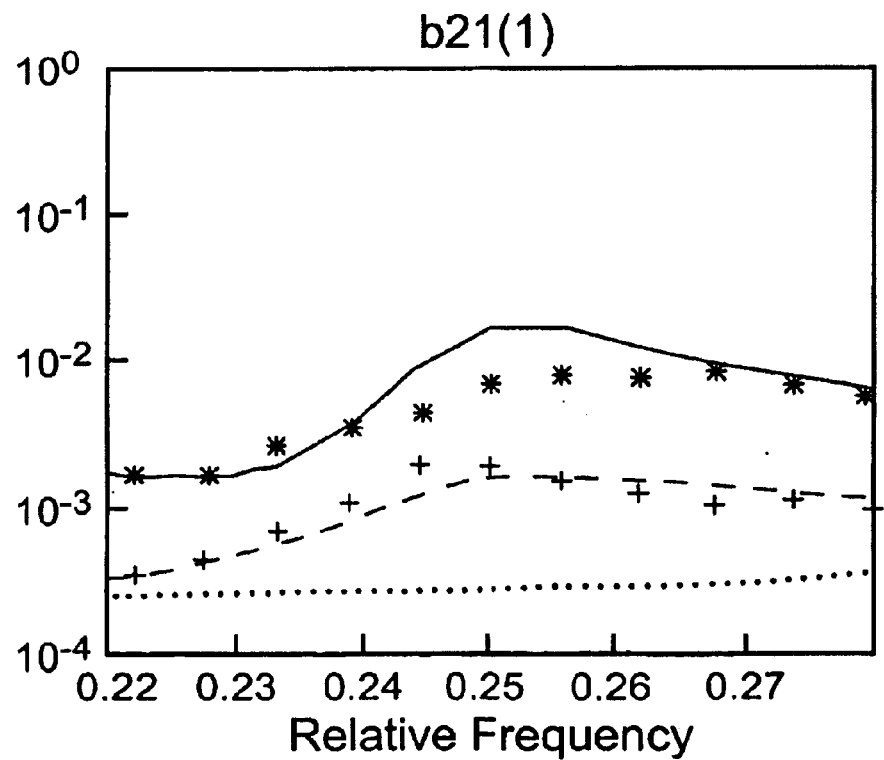

Apparently, it gets more difficult to estimate the channel parameters when the source colors are similar. Therefore, in FIGS. 2A–2D and FIGS. 3A–3D a more careful examination of the parameter accuracy is presented. The angles of the poles are in the interval [40°, 50°]. In FIGS. 2A–2D, the estimated mean value is depicted as a function of relative frequency. "*" denotes empirical mean value of the prior art signal separation algorithm; "+" denotes empirical mean value of the proposed weighting strategy. The solid lines correspond to the true parameter values. Note that the optimally weighted algorithm gets biased, although less biased than a prior art signal separation algorithm. This bias is probably an effect of the fact that the channel estimates of the unweighted algorithm are rather inaccurate, making the weighting matrix inaccurate as well. In FIGS. 3A–3D, the parameter variances is depicted as a function of relative frequency; "*" denotes empirical variance of the prior art signal separation algorithm [8]; "+" denotes empirical variance of the proposed weighting strategy. The solid line is the true asymptotic variance of the unweighted algorithm, and the dashed line is the true asymptotic variance for the optimally weighted algorithm. The dotted line is the CRB. As is indicated by the FIGS. 1A–1D, FIGS. 2A–2D, and FIGS. 3A–3D, the present invention increases the quality of the signal separation.

Further details of the present invention are that the method, according the device for separating signals, is repeatedly performed on the measured signal or on fractions thereof. Also, the method may be repeatedly performed according to a predetermined updating frequency. It should be noted that the predetermined updating frequency may not be constant. Further, the number of filter coefficients is predetermined. Finally, the number of filter coefficients is arranged to be predetermined in the above embodiment.

REFERENCES

[1] H. Broman, U. Lindgren, H. Sahlin, and P. Stoica. "Source Separation: A TITO System Identification Approach". esp, 1994.
[2] D. C. B. Chan. *Blind Signal Separation*, PhD Thesis, University of Cambridge, 1997.
[3] F. Ehlers and H. G. Schuster. Blind separation of convolutive mixtures and an application in automatic speech recognition in a noisy environment. *IEEE Trans. on Signal Processing* 45(10):2608–2612, 1997.
[4] M. Feder, A. V. Oppenheim, and E. Weinstein. Maximum likelihood noise cancellation using the EM algorithm, *IEEE Trans. on Acoustics, Speech, and Signal Processing*, ASSP-37:204–216. February 1989.
[5] W. A. Fuller. *Introduction to Statistical Time Series*. John Wiley & Sons, Inc. New York, 1996.
[6] U. Lindgren, H. Sahlin and H. Broman. Multi input multi output blind signal separation using second order statistics. Technical Report CTH-TE-54, Department of Applied Electronics, 1996.
[7] U. Lindgren and H. Broman. "Monitoring the mutual Independence of the Output of Source Separation Algorithms". In *IEEE International Symposium on Information Theory and Its Applications*, Victoria B.C., Canada, 1996.
[8] U-Lindgren and H. Broman. "Source Separation: Using a Criterion Based on Second Order Statistics". *IEEE Trans. on Signal Processing*, SP-46(7), July, 1998.
[9] L. Ljung. *System Identification: Theory for the User*, Prentice-Hall, Englewood Cliffs. N.J., 1987.
[10] L. Ljung. Personal Communication, 1998.
[11] D. Tuan Pham and P. Garat. "Blind Separation of Mixture of Independent Sources Through a Quasi-maximum Likelihood Approach". *IEEE Trans. on Signal Processing*, SP-45: 1712–1725, July, 1997.
[12] H. Sahlin and H. Broman. "Separation of Real World Signals". *Signal Processing*, 64(1):103–113, January, 1998.
[13] H. Sahlin and H. Broman. A decorrelation approach to blind mimo signal separation. In *Proceedings of ICA*, pages 383–388, 1999.
[14] H. Sahlin and U. Lindgren. "The Asymptotic Cramer-Rao Lower Bound for Blind Signal Separation". In the Procedings of the 8th Signal Processing Workshop on Statistical Signal and Array Processing, pages 328–331, Corfu, Greece, 1996.
[15] T. Söderström and P. Stoica. *System Identification*. Prentice-Hall, London, U.K., 1989.
[16] L. Tong, Y. R. Liu, V. Soon, and Y. Huang. Indeterminancy and identifiability of blind identification.
[17] S. van Gerven and D. van Compernolle. Signal Separation by symmetric adaptive decorrelation: stability, convergence and uniqueness. *IEEE Trans. on Signal Processing*, 43:1602–1612, 1995.
[18] M. Viberg and A. L. Swindlehurst. "Analysis of the Combined Effects of Finite Samples and Model Errors on Array Processing Performance". *IEEE Trans. on Signal Processing*, SP-42: 1–12, Nov. 1994.
[19] H. Wu and J. Principe. A unifying criterion for blind source separation and decorrelation: simultaneous diagonalization of correlation matrices In *Proc. of NNSP97*, pages 496–505, Amelia Island, Fla., 1997.
[20] H. Wu and J. Principe. Simultaneous diagonalization in the frequency domain (sdif) for source separation. In *ICA*, pages 245–250, Aussois, France, 1999.

What is claimed is:

1. A method for separating a mixture of source signals to regain the source signals, the method being based on measured signals, the method comprising:

bringing each measured signal to a separation structure including an adaptive filter, the adaptive filter comprising filter coefficients;

using a generalized criterion function for obtaining the filter coefficients, the generalized criterion function comprising cross correlation functions and a weighting matrix, the cross correlation functions being dependent on the filter coefficients;

said weighting matrix, being an inverse matrix of a matrix comprising an estimation of a covariant matrix for a signal;

said signal having a spectrum being a product of estimated spectrum of an incoming source-signal and the determinant of an estimated transformation function of a mixing filter;

estimating the filter coefficients, the resulting estimates of the filter coefficients corresponding to a minimum value of the generalized criterion function; and updating the adaptive filter with the filter coefficients.

2. The method according to claim 1, wherein said spectrum of the incoming source-signal is unknown and the weighting matrix considers an assumed spectrum.

3. The method according to claim 1, wherein the weighting matrix is dependent on the filter coefficients.

4. The method according to claim 1, wherein the method is repeatedly performed on the measured signal or on fractions thereof.

5. The method according to claim 4, wherein the method is repeatedly performed according to a predetermined updating frequency.

6. The method according to claim 1, wherein the number of filter coefficients is predetermined.

7. A device for separating a mixture of source signals to regain the source signals, the input to the device being based on measured signals, the device comprising:

signaling links for bringing each measured signal to a separation structure including an adaptive filter, the adaptive filter comprising filter coefficients;

a generalized criterion function means for obtaining the filter coefficients, the generalized criterion function means comprising cross correlation functions and a weighting matrix, the cross correlation functions being dependent on the filter coefficients;

said weighting matrix, being an inverse matrix of a matrix comprising an estimation of a covariant matrix for a signal;

said signal having a spectrum being a product of estimated spectrum of an incoming source-signal and the determinant of an estimated transformation function of a mixing filter;

means for estimating the filter coefficients, the resulting estimates of the filter coefficients corresponding to a minimum value output of the generalized criterion function; and updating means for updating the adaptive filter with the filter coefficients.

8. The device according to claim 7, wherein the weighting matrix is dependent on the filter coefficients.

9. The device according to claim 7, wherein the device is arranged to separate the measured signals or fractions thereof repeatedly.

10. The device according to claim 9, wherein the device is arranged to separate the measured signals or fractions thereof according to a predetermined updating frequency.

11. The device according to claim 7, wherein the number of filter coefficients is arranged to be predetermined.

* * * * *